US010559525B2

(12) United States Patent
Yu

(10) Patent No.: US 10,559,525 B2
(45) Date of Patent: Feb. 11, 2020

(54) EMBEDDED SILICON SUBSTRATE FAN-OUT TYPE 3D PACKAGING STRUCTURE

(71) Applicant: HUATIAN TECHNOLOGY (KUNSHAN) ELECTRONICS CO., LTD., Kunshan, Jiangsu (CN)

(72) Inventor: Daquan Yu, Kunshan (CN)

(73) Assignee: HUATIAN TECHNOLOGY (KUNSHAN) ELECTRONICS CO., LTD., Kunshan (CN)

(*) Notice: Subject to any disclaimer, the term of this patent is extended or adjusted under 35 U.S.C. 154(b) by 0 days.

(21) Appl. No.: 16/109,955

(22) Filed: Aug. 23, 2018

(65) Prior Publication Data
US 2018/0366403 A1 Dec. 20, 2018

Related U.S. Application Data

(63) Continuation of application No. PCT/CN2016/101437, filed on Oct. 7, 2016.

(30) Foreign Application Priority Data

Feb. 23, 2016 (CN) .......................... 2016 1 0098740

(51) Int. Cl.
H01L 23/52 (2006.01)
H01L 23/498 (2006.01)
(Continued)

(52) U.S. Cl.
CPC ...... H01L 23/49838 (2013.01); H01L 21/486 (2013.01); H01L 21/4853 (2013.01);
(Continued)

(58) Field of Classification Search
CPC ............... H01L 21/486; H01L 21/4853; H01L 23/49827; H01L 23/147; H01L 23/49838;
(Continued)

(56) References Cited

U.S. PATENT DOCUMENTS 7,838,337 B2 * 11/2010 Marimuthu ........... H01L 21/565
438/110
8,847,376 B2 * 9/2014 Oganesian .......... H01L 23/5389
257/686
(Continued)

FOREIGN PATENT DOCUMENTS

CN 1893053 A 1/2007
CN 103646943 A 3/2014
(Continued)

OTHER PUBLICATIONS

The Second Office Action, The State Intellectual Property Office of People's Republic of China, 201610098740.2, Huatian Technology (Kunshan) Electronics Co., Ltd., Fan-Out Type 3D Packaging Structure Embedded in Silicon Substrate.
(Continued)

Primary Examiner — Luan C Thai
(74) Attorney, Agent, or Firm — Flener IP & Business Law; Zareefa B. Flener

(57) ABSTRACT

An embedded silicon substrate fan-out type 3D packaging structure, comprising: a silicon substrate; and at least one functional chip, wherein the silicon substrate includes at least one groove, the at least one functional chip is embedded in the at least one groove with a pad surface facing upward, the at least one functional chip is bonded with the at least one groove through a polymer; a front surface of the silicon substrate, the pad surface of the at least one functional chip, and at least one gap between the at least one chip and the at least one groove are covered with a polymer material, and the polymer on pads on the at least one functional chip is opened; at least one conductive through hole is formed on the silicon substrate; and the silicon substrate further includes electrical interconnect structures, a first metal re-wiring and a second metal re-wiring.

15 Claims, 4 Drawing Sheets

(51) Int. Cl.
  *H01L 23/00* (2006.01)
  *H01L 21/48* (2006.01)
  *H01L 23/13* (2006.01)
  *H01L 23/14* (2006.01)
  *H01L 23/31* (2006.01)
  *H01L 23/538* (2006.01)

(52) U.S. Cl.
  CPC .......... *H01L 23/13* (2013.01); *H01L 23/147* (2013.01); *H01L 23/3192* (2013.01); *H01L 23/49816* (2013.01); *H01L 23/49827* (2013.01); *H01L 23/5389* (2013.01); *H01L 24/19* (2013.01); *H01L 24/24* (2013.01); *H01L 24/32* (2013.01); *H01L 24/82* (2013.01); *H01L 24/29* (2013.01); *H01L 24/73* (2013.01); *H01L 24/92* (2013.01); *H01L 24/97* (2013.01); *H01L 2224/0231* (2013.01); *H01L 2224/02379* (2013.01); *H01L 2224/04105* (2013.01); *H01L 2224/12105* (2013.01); *H01L 2224/13024* (2013.01); *H01L 2224/24227* (2013.01); *H01L 2224/2919* (2013.01); *H01L 2224/32225* (2013.01); *H01L 2224/73267* (2013.01); *H01L 2224/82031* (2013.01); *H01L 2224/82039* (2013.01); *H01L 2224/92244* (2013.01); *H01L 2224/97* (2013.01); *H01L 2924/0665* (2013.01); *H01L 2924/157* (2013.01); *H01L 2924/15153* (2013.01); *H01L 2924/15311* (2013.01); *H01L 2924/3511* (2013.01)

(58) Field of Classification Search
  CPC .......... H01L 23/49816; H01L 23/5389; H01L 23/13; H01L 23/3192; H01L 24/32; H01L 24/19; H01L 24/82

USPC ........................................................ 257/738
See application file for complete search history.

(56) References Cited

U.S. PATENT DOCUMENTS

| | | | |
|---|---|---|---|
| 2003/0183944 A1* | 10/2003 | Taniguchi | H01L 25/0657 257/777 |
| 2008/0157316 A1 | 7/2008 | Yang | |
| 2012/0020026 A1 | 1/2012 | Oganesian et al. | |
| 2012/0056312 A1 | 3/2012 | Pagaila et al. | |

FOREIGN PATENT DOCUMENTS

| | | |
|---|---|---|
| CN | 104485320 A | 4/2015 |
| CN | 105023900 A | 11/2015 |
| CN | 105575913 A | 5/2016 |
| CN | 205488088 U | 8/2016 |

OTHER PUBLICATIONS

European Patent Office, PCT/CN2016101437, Huatian Technology (Kunshan) Electronics Co., Ltd., Sep. 1, 2019, Extended European Search Report.
International Search Report, PCT/CN2016/101437, dated Jan. 20, 2017.
Written Opinion of the International Searching Authority, dated Jan. 20, 2017, Patent Cooperation Treaty, PCT/CN2016/101437, Huatian Technology (Kunshan) Electronics Co., Ltd.

* cited by examiner

EMBEDDED SILICON SUBSTRATE FAN-OUT TYPE 3D PACKAGING STRUCTURE

CROSS-REFERENCE TO RELATED APPLICATIONS

The present application is a continuation of International Patent Application No. PCT/CN2016/101437 filed on Oct. 7, 2016, which claims priority to Chinese Patent Application No. 201610098740.2, filed on Feb. 23, 2016, all contents of which are incorporated by reference herein.

TECHNICAL FIELD

The embodiments of the present invention relate to the field of electronic packaging technology, particularly to an embedded silicon substrate fan-out type 3D packaging structure.

BACKGROUND

In the current semiconductor industry, electronic packaging has become an important direction of the industry development. The development of packaging technology for decades has made the high-density and small-size packaging requirements become the main stream direction of encapsulation.

Wafer-level Fan-out package, by reconstructing a wafer and wafer-level rewiring way, fills the package surface with I/Os through a rewiring plane array, in order to expand I/O pitches and satisfy pitch demands of the next level interconnection. At present, the material for reconstructing the wafer is mainly molding compound, or an organic material such as a semi-cured wafer used for the substrate package, so as to realize the plastic sealing of the fan-out structure of the functional chip, and finally cut into a single package.

At present, through the research and development and industry promotion for many years, the wafer-level fan-out package is considered to be an advanced packaging technology with a large number of I/Os and good integration flexibility. With the development of smart phones, 3D stacking technology requirements are proposed for the fan-out type package. For example, Package on Package (PoP) was used to encapsulate integrated a microprocessor chip and memory chip, and the lower package of PoP uses BGA packaging mode. Now, forming the micro-processed 3D fan-out type packaging structure by making vertical through holes in the molding compound, which can replace the PoP lower packaging mode, and can achieve a higher density and a smaller size interconnection. Moreover, from the perspective of the industrial chain, it can be directly completed in a foundry or packaging factory without substrate materials.

With the development of electronic products towards to thinner, lighter, higher pin density, lower cost, and system integration, the single functional chip packing technology has gradually cannot meet industrial demands, and the emergence of the fan-out wafer-level packaging technology provides an opportunity for the packaging industry to develop towards the low cost packaging. Thus, the fan-out wafer-level technology is currently developing into the next generation major packaging technology.

However, the outstanding problem of the current fan-out type package is that the molding compound is used to reconstruct the wafer, and there is a great difference between the processing of the molding compound wafer and the manufacture of the traditional silicon wafer. Photolithography, development, exposure, fabrication of fine metal lines and planting balls on silicon wafers are very mature. However, the molding compound itself is very unsuitable for the above processes, especially for the foundry. Therefore, in order to develop a fan-out process based on molding compound wafers, many process challenges need to be overcome, and customized relevant equipment is needed to solve the difficult problems including holding of the easy-to-warp molding compound wafer and the preparation of fine lines on the surface of the molding compound. Furthermore, from the perspective of the structure itself, the difference of thermal expansion coefficients between the molding compound and silicon is large, which will bring reliability problems. It has been reported that the fan-out structure is not suitable for the ultra-high 12×12 mm$^2$ package. For chips with high power consumption, the heat dissipation of the molding compound is also a problem.

SUMMARY

In order to solve the above technical problems, the invention provides an embedded silicon substrate fan-out type 3D packaging structure, which uses a silicon substrate instead of molding compound or other non-silicon material as a fan-out substrate, and solves a series of problems, such as warpage, mismatch of thermal expansion coefficients, caused by the molding compound reconstruction wafer; high-density wiring is prepared by a mature process on the silicon substrate; and vertical conductive through holes can be fabricated on the silicon substrate by various methods to realize the three-dimensional vertical interconnection.

The packaging structure according to an embodiment of the present invention, comprising: a silicon substrate and at least one functional chip, wherein the silicon substrate includes at least one groove, the at least one functional chip is embedded in the at least one groove with a pad surface facing upward, the at least one functional chip is bonded with the at least one groove through a polymer; a front surface and of the silicon substrate, the pad surface of the at least one functional chip, as well as at least one gap between the at least one functional chip and the at least one groove are covered with a polymer material, the polymer material is photosensitive, and the polymer on pads on the at least one functional chip is opened; at least one conductive through hole penetrating the silicon substrate and electrically connected to the pads is formed on the silicon substrate except for at least one position where the at least one groove is located; and the silicon substrate further includes electrical interconnect structures located on both the front surface and a back surface of the silicon substrate, and a first metal re-wiring located on the front surface and a second metal re-wiring located on the back surface, the pads are electrically connected to the electrical interconnect structures located on the front surface and the at least one conductive through hole through the first metal re-wiring, and the electrical interconnect structures located on the back surface are electrically connected to the at least one conductive through hole through the second metal re-wiring.

In an embodiment, the packaging structure further comprises: a first passivation layer located on the first metal re-wiring and a second passivation layer located on the second metal re-wiring, wherein openings are formed at preset positions of the first passivation layer and the second passivation layer to form the electrical interconnect structures.

In an embodiment, the polymer bond between the at least one functional chip and the at least one groove is epoxy.

In an embodiment, the at least one conductive through hole is axially perpendicular to the front surface of the silicon substrate.

In an embodiment, a metal filled in the at least one conductive through hole is one or more of titanium, tantalum, chromium, tungsten, copper, aluminum, nickel and gold.

In an embodiment, a metal filled in the at least one conductive through hole is one of low melting point solders including tin, tin silver, tin copper, tin gold, tin indium and tin silver copper.

In an embodiment, the at least one conductive through hole is filled with a conductive adhesive.

In an embodiment, a vertical cross-sectional of the at least one groove is rectangular or trapezoidal, and a depth of the at least one groove is less than or equal to a thickness of the silicon substrate.

In an embodiment, an upper opening of the at least one groove is larger than a bottom of the at least one groove.

In an embodiment, the electrical interconnect structures are one of solder balls, metal bumps and conductive adhesives.

In an embodiment, the first metal re-wiring and the second metal re-wiring are made of one of copper, nickel, target and gold.

In an embodiment, the first metal re-wiring and the second metal re-wiring are formed by one method of electroplating, electroless plating, vacuum evaporation and physical vapor deposition.

In an embodiment, forming processes of the first metal re-wiring and the second metal re-wiring include: depositing a seed metal layer on an insulating layer, coating, photolithography, exposure, development, electroplating, degumming and etching the seed metal layer.

In an embodiment, forming processes of the first metal re-wiring and the second metal re-wiring include: depositing a seed metal layer on an entire surface of an insulating layer, exposing a metal re-wiring pattern on the seed metal layer, forming a metal circuit on the exposed metal re-wiring pattern and removing the seed metal layer outside the metal re-wiring pattern.

In an embodiment, the silicon substrate is a wafer, and the at least one groove includes a plurality of grooves arranged in array.

In an embodiment, the at least one functional chip is an integrated circuit chip or a MEMS chip.

In the packaging structure according to the embodiments of the present invention, the functional chip is embedded in the groove of the silicon substrate having the same material through the organic polymer adhesion. Vertical conductive through holes are prepared in regions of the front surface of the silicon substrate that do not contain the groove, the functional chip can lead out electrical properties to the back surface of the silicon substrate through the conductive through holes, and metal wiring and solder balls can be prepared on the front and back surfaces of the silicon substrate. The advantages of the structure are as follows: firstly, since the thermal expansion coefficients between the silicon substrate and the chip are near, the packaging structure has a good reliability; secondly, the structure can realize 3D package interconnection; thirdly, the silicon substrate can be used to make fine lines and high density wiring, which can meet the needs of the high density interconnection; finally, the packaging structure can be relatively easy to realize miniaturization and thinness.

BRIEF DESCRIPTION OF DRAWINGS

The above and other aspects of the present invention will become more apparent from the following detailed description when taken in conjunction with the accompanying drawings in which.

DETAILED DESCRIPTION

Figure 1:
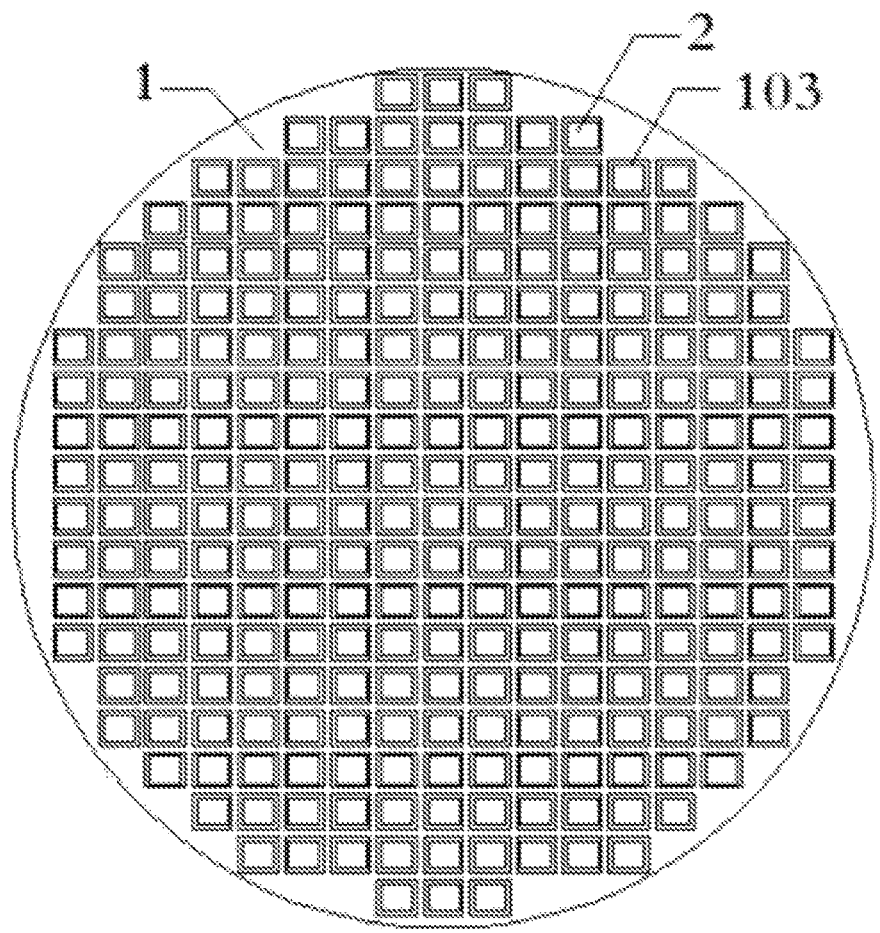
FIG. 1 is a top view of the silicon substrate embedded with functional chips when a silicon substrate is a wafer according to an embodiment of the present invention.

In order to make the present invention easy to understood, the following embodiments are described in detail, and their purpose is only to help understanding of the contents of the present invention, rather than limiting the protection scope of the present invention. The components of structures in the drawings of the embodiments are not scaled according to normal proportions, which do not represent actual relative size of structures in the embodiments.

Patent Document ZL201210243958.4 discloses a fan-out type wafer-level functional chip packaging method, comprising a functional chip, a metal microstructure, a high-density wiring layer, a silicon cavity, a bonding layer and solder ball bumps. The metal microstructure is formed on the functional chip by sputtering, lithography, electroplating, etc. The functional chip is inverted on the high-density wiring layer, and a concave silicon cavity is formed on the silicon cavity by optical masking, etching, or the like. The silicon cavity buckles the functional chip in the silicon cavity. The high-density wiring layer and the silicon cavity are bonded by the bonding layer, and the sealing material layer and the bonding layer are solidified by heating. However, the invention has a complicated process and high cost, and is not suitable for a thin packaging process.

Patent Document ZL201110069815.1 discloses a fan-out system packaging method, which comprises the following steps: providing a carrier board, forming a peeling film on the carrier board, forming a protective layer on the peeling film, and forming a re-wiring metal layer in the protective layer, a wiring packaging layer, which is connected with the re-wiring metal layer, is formed on the protective layer, a wire bonding packaging layer is formed on the wiring packaging layer, and each group of packaging layer is electrically connected to each other. The carrier board and the peeling film are removed to expose the re-wiring metal in the first protective layer, and metal solder balls are formed on the exposed re-wiring metal. The technical solution of the patent can reduce the resistance, inductance and interference factors between functional chips in the system.

Patent Document ZL201110032264.1 discloses a highly-integrated wafer fan-out packaging structure, which comprises: a packaged unit, consisting of a functional chip and a passive device, the packaged unit having a functional surface; a sealing layer is formed the opposite side of the functional surface of the packaged unit. The packaged unit is packaged and cured by the sealing layer, and a groove is provided between the surface of the sealing layer corresponding to the packaged unit and the packaged unit. Chinese patent 201110032591.7 discloses a highly-integrated wafer fan-out packaging method, comprising the following steps: (1) forming a gluing layer on a carrier board; (2) attaching a functional surface of a packaged unit composed of a functional chip and a passive device to the gluing layer; (3) forming a sealing layer on a side of the carrier board attached with the functional chip and the passive device, and packaging and curing, a groove being provided between the surface of the sealing layer corresponding to the packaged unit and the packaged unit (4) removing the carrier board and the gluing layer. The above patents can avoid warping deformation of the sealing layer in the subsequent process of wafer package, and improve the quality of wafer packaging products.

Although the above prior arts have improved the packaging method, they failed to solve the problems of complex process and high cost in the fan-out wafer-level process, and are not suitable for 3D integration.

Figure 11:
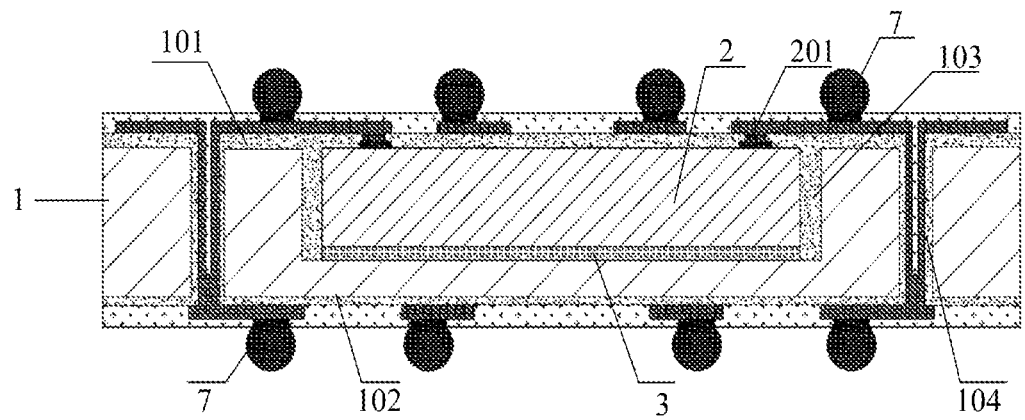
FIG. 11 is a schematic diagram illustrating a structure of forming solder balls at positions of the openings on the first and second passivation layers according to an embodiment of the present invention.

As shown in FIG. 11, an embedded silicon substrate fan-out type 3D packaging structure includes a silicon substrate 1 and at least one functional chip 2. The silicon substrate 1 encapsulates other surfaces of the functional chip that do not contain a functional surface 202 through a groove 103, and a bonding layer is arranged between the functional chip 2 and the silicon substrate 1. A plurality of vertical conductive through holes 104 are arranged near the groove on the silicon substrate 1, at least one pad 201 on the functional chip 2 is electrically connected to the conductive through holes 104, and electrical interconnect structures 7 are formed on a front surface 101 and a back surface 102 of the silicon substrate 1. The electrical interconnect structures 7 located on the front surface 101 are electrically connected to the pads 201, and the electrical interconnect structures 7 located on the back surface 102 are electrically connected to the conductive through holes 104.

In the packaging structure according to the embodiment of the present invention, the functional chip 2 is embedded in the groove 103 by making the groove 103 on the front surface 101 of the silicon substrate 1 having the same material as the functional chip 2, at least one conductive through hole 104 is formed in a region of the front surface 101 of the silicon substrate 1 does not include the groove 103, the electricity property of the pads 201 of the functional chip 2 is lead out to the back surface 102 of the silicon substrate 1 through the conductive through holes 104, and electrical interconnect structures 7 are prepared on the front surface 101 and the back surface 102 of the silicon substrate 1, thus an external chip or a printed circuit board can be electrically connected to the functional chip 2 embedded in the silicon substrate 1 through the electrical interconnect structures 7 on the front surface 101 and the back surface 102 of the silicon substrate 1, and the special functions required in 3D package are realized. It can effectively solve the problems such as the mismatch of thermal expansion coefficients caused by the current application of molding compound fan-out packaging and the process difficulties caused by the warpage of the molding compound reconstituted wafer. Meanwhile, all operations of the invention are only carried out on the silicon substrate 1, and the process is mature, and suitable for the high density interconnection and package miniaturization.

In an embodiment, the functional chip 2 is an integrated circuit chip or a MEMS chip.

Preferably, the vertical cross-sectional of the groove 103 is rectangular or trapezoidal, and the depth of the groove 103 is not greater than the thickness of the silicon substrate 1.

Preferably, the conductive through holes 104 are axially perpendicular to the front surface 101 of the silicon substrate 1.

The metal filled in the conductive through holes 104 can be one or more of metal materials such as titanium, tantalum, chromium, tungsten, copper, aluminum, nickel and gold, and realized by physical vapor deposition, electroplating filling and so on. They can also be filled with low melting point solders, such as one of tin, tin silver, tin copper, tin gold, tin indium, tin silver copper, etc. The conductive through holes 104 can also be filled with a conductive adhesive, through holes can be made, and then the conductive adhesive is printed and filled. Preferably, the conductive through holes 104 are filled with titanium and copper metal, wherein titanium is an adhesive layer.

As a preferred embodiment, a manufacture method for an embedded silicon substrate fan-out type 3D packaging structure according to the present invention includes the following steps:

A. A silicon substrate 1 having the same material as a functional chip 2 is provided. The silicon substrate 1 has a front surface 101 and a back surface 102 opposite thereto, and at least one groove 103 is etched on the front surface 101 of the silicon substrate 1.

The shape of the groove 103 may be trapezoidal, rectangular or other can be used to represent a groove. The upper opening of the groove 103 can be larger than the bottom of the groove 103.

In a preferred embodiment, the depth of the groove 103 is equivalent to the thickness of the functional chip 2, and the size of the groove 103 can meet the placement of the functional chip 2.

Preferably, the silicon substrate 1 is a wafer, and a plurality of grooves 103 arranged in array are formed on the wafer, and sidewalls of the grooves 103 are vertical, as shown in FIG. 1.

Figure 2:
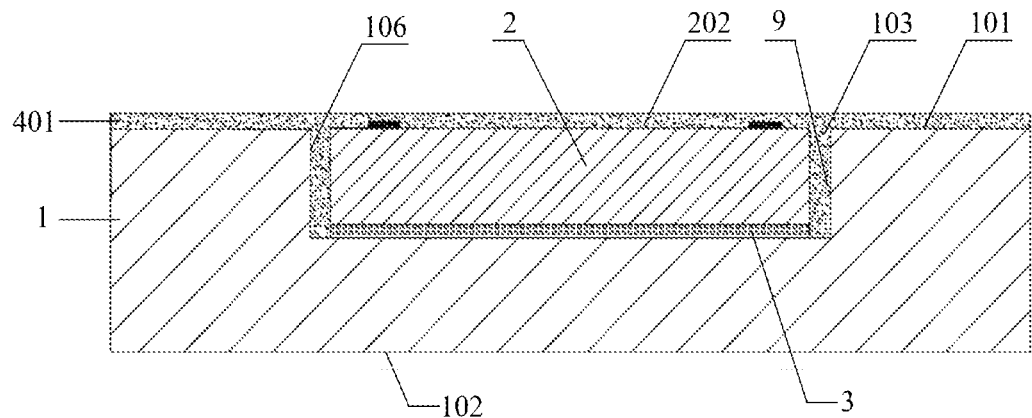
FIG. 2 is a schematic cross-sectional diagram of embedding a chip in a front surface of the wafer and preparing a first insulating layer thereon according to an embodiment of the present invention.

B. Referring to FIG. 2, at least one function chip 2 is attached in the groove 103 through a bonding layer 3, and the pad surface (i.e. functional surface) 202 of the functional chip 2 faces outward.

The pad surface 202 of the functional chip 2 is close to the front surface 101 of the silicon substrate 1, and gaps 9 are formed between the function chip 2 and sidewalls 106 of the groove 103. When it is implemented, the functional chip 2 can be attached to the groove 103 of the silicon substrate 1 by epoxy or a dry film. The connection mode adopted in the embodiment of the present embodiment is bonding by using epoxy, and the gaps 9 between the function chip 2 and the sidewalls 106 of the groove 103 are filled and bonded by a first insulating layer 401. In an embodiment, the gaps 106 are filled with a polymer.

Figure 3:
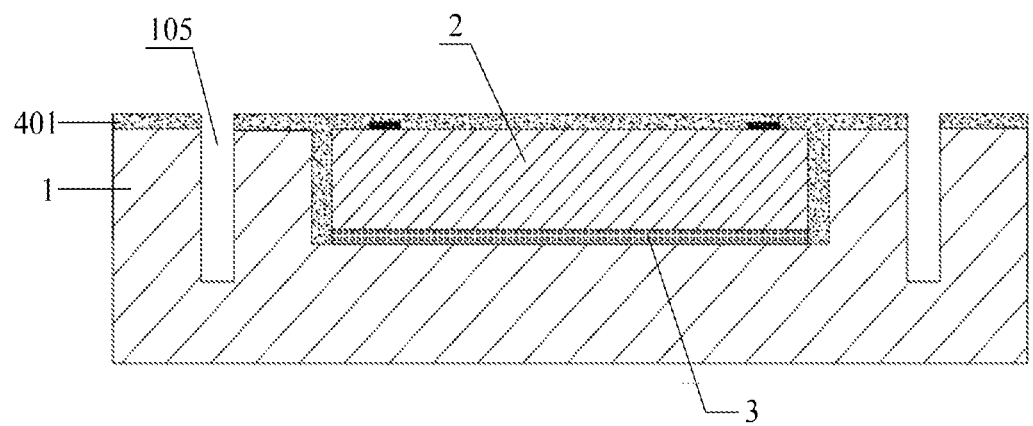
FIG. 3 is a schematic diagram illustrating a structure of forming silicon blind holes on the first insulating layer by photolithography/etching according to an embodiment of the present invention.

C. Referring to FIG. 3, the first insulating layer 401 is laid in the gaps 9 and on the entire surface of the pad surface 202 of the functional chip 2 and the front surface 101 of the silicon substrate 1. At least one silicon blind hole 105 with a certain depth is formed in at least one region of the front surface 101 of the silicon substrate 1 does not include the groove 103. Taking conductive through holes 104 in FIG. 4 as an example, that is, the conductive through holes 104 are formed on the silicon substrate 1 except for the position where the groove 103 is located.

When it is implemented, an opening can be exposed at a position on the first insulating layer 401 where the silicon blind hole 105 is preset by using a lithography process. The lithography process mainly includes coating of photoresist, exposure, development and other operations. Then, the opening is deeply etched to form the silicon blind hole 105 with a certain depth. The etching can be divided into dry etching and wet etching, and dry etching is a new type, which uses plasma to perform etching processing of semiconductor materials. As a preferred implementation, the silicon blind hole 105 with a certain depth is formed through dry etching according to the present invention.

Figure 4:
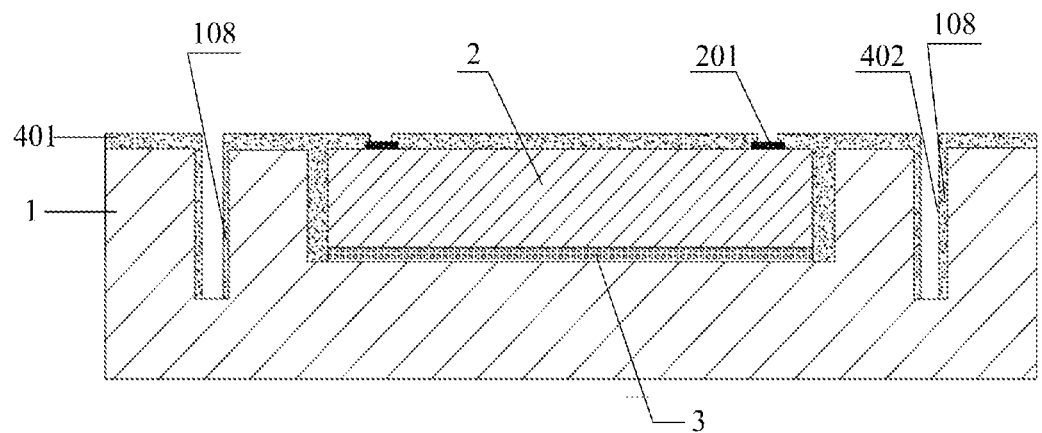
FIG. 4 is a schematic diagram illustrating a structure of preparing a second insulating layer on the first insulating layer and in the silicon blind holes and exposing chip pads by photolithography/etching according to an embodiment of the present invention.

D. Referring to FIG. 4, a second insulating layer 402 is laid on the first insulating layer 401 and entire inner surfaces 108 of the silicon blind holes 105, and pads 201 of the functional chip 2 are exposed.

The material of the second insulating layer 402 may be the same as or similar to that of the first insulating layer 401. The pads 201 of the functional chip 2 under the first insulating layer 401 and the second insulating layer 402 are exposed through etching or photolithography. Preferably, the second insulating layer 402 is filled in the silicon blind holes 105 by spraying.

Figure 5:
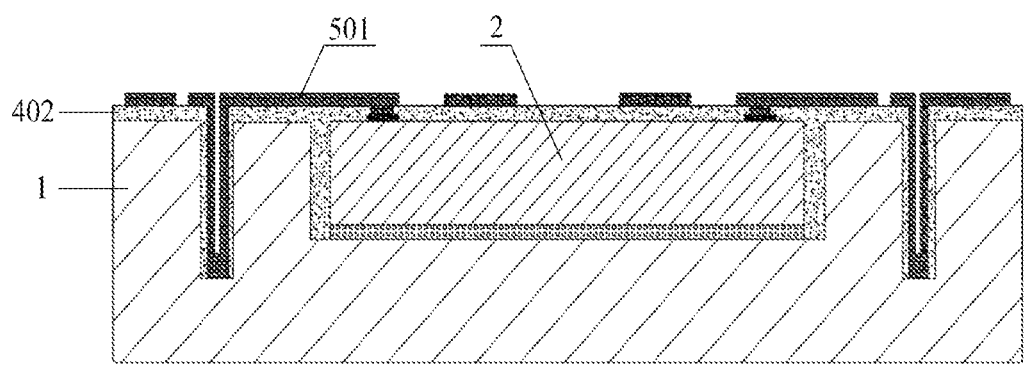
FIG. 5 is a schematic diagram illustrating a structure of filling a metal in the silicon blind holes and forming a first metal re-wiring on the surface according to an embodiment of the present invention.

E. Referring to FIG. 5, a metal is filled in the silicon blind holes 105, and a first metal re-wiring 501 is laid on the second insulating layer 402 of the front surface 101.

The first metal re-wiring 501 is electrical connected to the pads 201 of the functional chip 2, and pads for forming the electrical interconnect structures 7 are formed on the first metal re-wiring 501. That is, the pads 201 are electrically connected to the electrical interconnect structures 7 located on the front surface 101 and the conductive through holes 104 through the first metal re-wiring 501.

When it is implemented, the metal material of each layer of metal re-wiring can be one of copper, nickel, target and gold. The method for forming the metal re-wiring can be one of electroplating, electroless plating, vacuum evaporation and physical vapor deposition. The metal filling in the silicon blind holes 105 can fill the holes or only fill a part. In the embodiment, the blind holes 105 are not filled with the metal for cost reasons.

Preferably, the metal re-wiring in the silicon blind holes is made of titanium or copper.

Figure 6:
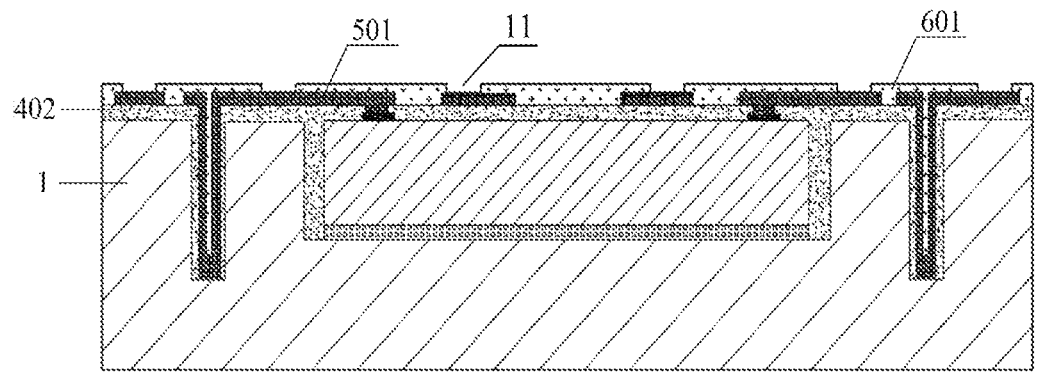
FIG. 6 is a schematic diagram illustrating a structure of forming a first passivation layer on the first metal re-wiring and opening corresponding passivation layer openings on the metal wiring according to an embodiment of present invention.

F. Referring to FIG. 6, a first passivation layer 601 is formed on the first metal re-wiring 501, the first passivation layer 601 is opened at preset pad positions 11 on the first metal re-wiring 501, and the pads are prepared.

Figure 7:
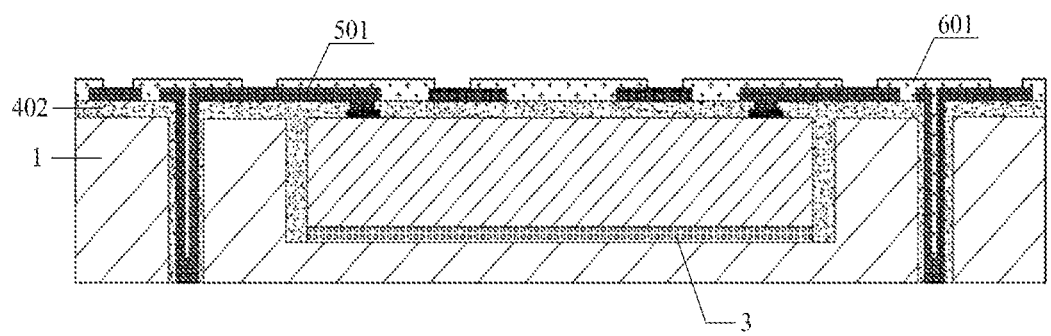
FIG. 7 is a schematic diagram illustrating a structure of thinning a back surface of the silicon substrate wafer to expose the metal in the silicon blind holes according to an embodiment of the present invention.

G. Referring to FIG. 7, the back of the silicon substrate 1 is ground and thinned to expose the metal in the silicon blind holes 105.

The thinning process of the silicon substrate can be any one of grinding, dry and wet etching, or a combination of any two of the above three methods.

Figure 8:
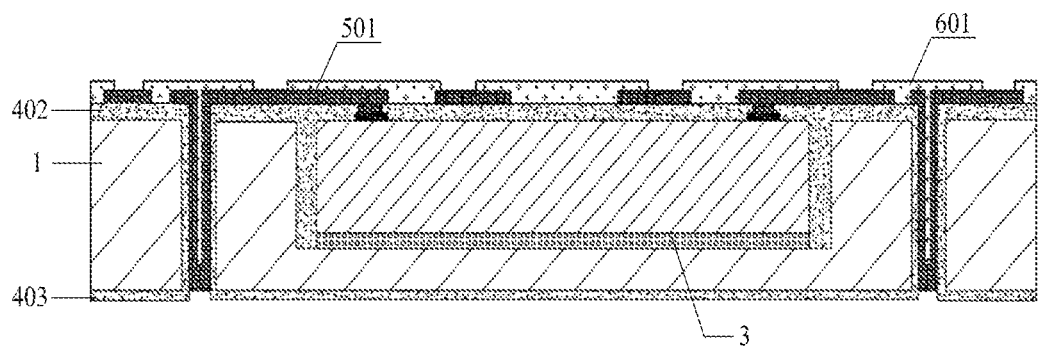
FIG. 8 is a schematic diagram illustrating a structure of laying a third insulating layer on the back surface of the thinned silicon wafer and exposing the first metal re-wiring in the silicon blind holes according to an embodiment of the present invention.
Figure 9:
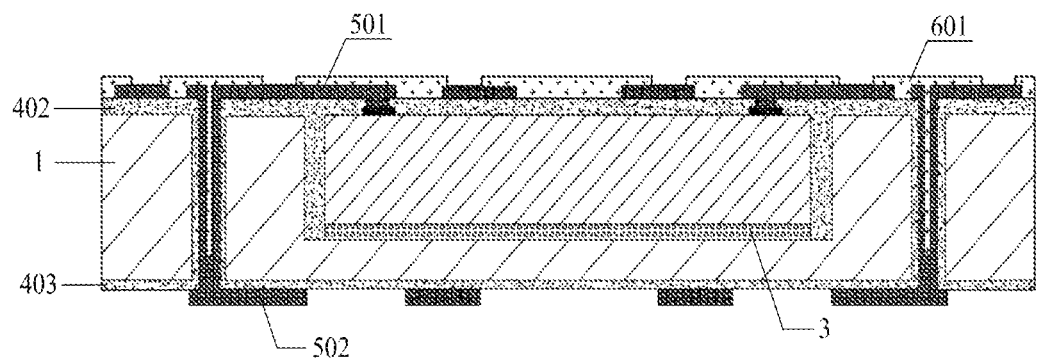
FIG. 9 is a schematic diagram illustrating a structure of performing rewiring on the third insulating layer to form a connection with the metal in the conductive through holes according to an embodiment of the present invention.

H. Referring to FIG. 8 and FIG. 9, a third insulation layer 403 is laid on the back surface 102 of the silicon substrate 1, the metal in the silicon blind holes 105 is exposed by photolithography, development, exposure and other processes. A second metal re-wiring 502 is laid on the third insulating layer 403, and electrically connected with the conductive through holes 104, that is, the electrical interconnect structures 7 located on the back surface 102 are electrically connected to the conductive through holes 104 through the second metal re-wiring 502.

Figure 10:
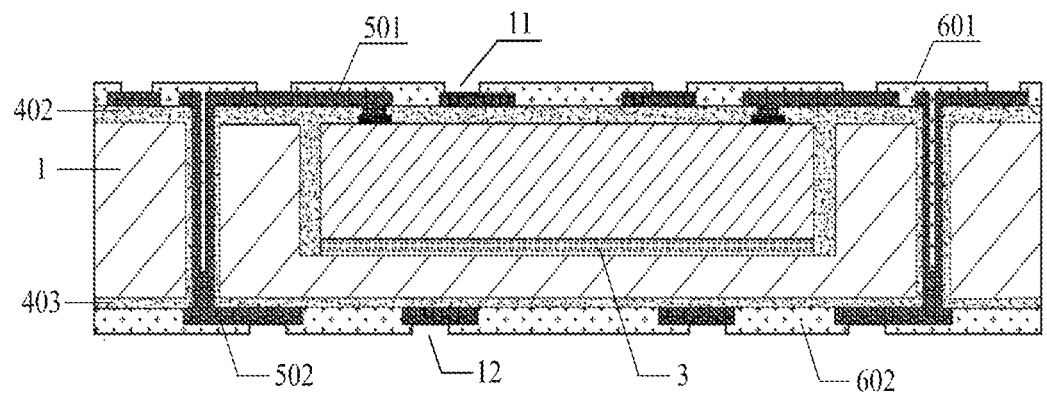
FIG. 10 is a schematic diagram illustrating a structure of laying a second passivation layer on the second metal re-wiring and opening corresponding passivation layer openings on the metal wiring according to an embodiment of the present invention.

I. Referring to FIG. 10, a second passivation layer 602 is formed on the second metal re-wiring 502, the second passivation layer 602 is opened at preset pad positions 12 on the second metal re-wiring 502, and the pads are prepared.

J. Referring to FIG. 11, electrical interconnect structures 7 are formed at the pads on the front surface 101 and the back surface 102 of the silicon substrate 1. The electrical interconnect structures 7 can be solder balls, metal bumps, or conductive adhesives, etc., and the solder balls are preferred in this embodiment. The method of forming solder balls can be firstly forming solder balls on the front surface 101 and then forming solder balls on the back surface 102 of the silicon substrate 1.

Preferably, the forming processes of the first metal re-wiring 501 and the second metal re-wiring 502 include depositing a seed metal layer on the insulating layer, coating, photolithography, exposure, development, electroplating, degumming and etching the seed metal layer. Alternatively, the seed metal layer is deposited on the entire surface of the insulating layer, a metal re-wiring pattern is exposed on the seed metal layer by photolithography, a metal circuit is formed on the exposed metal re-wiring pattern by electroplating/electroless plating, and finally, the seed metal layer outside the pattern is removed to form the metal re-wiring.

Another method of forming the structure of the present invention may be as follows: (1) preparing a vertical through hole 104 interconnection structure on a silicon substrate 1, the hole can be a laser ablated through hole, and then preparing insulating layers and seed layers, and electroplating filling, liquid metal solder filling, or conductive adhesive printing filling. Preferably, it is filled with metal by electroplating; (2) etching the silicon substrate 1 to make grooves 103, and embedding functional chips 2 are into the grooves 103; (3) preparing a re-wiring metal layer 501 on the front surface 101, at least one of pads 201 on a functional chip 2 is electrically connected to a vertical conductive through hole 104; preparing a passivation layer 601, opening the passivation layer 601 at preset pad positions 11, preparing the pads, and printing welding balls or preparing metal bumps; (4) preparing a re-wiring metal layer 502 on the back surface 102, the metal wiring 502 is connected to the vertical conductive through hole 104; preparing a passivation layer 602, opening the passivation layer 602 at preset pad positions 12, preparing the pads, and printing welding balls or preparing metal bumps; (5) cutting to form a final single package.

The preferred embodiments of the present invention are described in detail with reference to drawings. Various changes and modifications for the forms of the above embodiments made by those skilled in the art, but without departing from the essence of the present invention, will fall into the protection scope of the present invention.

What is claimed is:

1. An embedded silicon substrate fan-out type 3D packaging structure, comprising:
    a silicon substrate and
    at least one functional chip,
    wherein the silicon substrate includes at least one groove, the at least one functional chip is embedded in the at least one groove with a pad surface facing upward, the at least one functional chip is bonded with the at least one groove through a polymer; a front surface of the silicon substrate, the pad surface of the at least one functional chip, as well as at least one gap between the at least one functional chip and the at least one groove are covered with a first insulating layer; at least one conductive through hole penetrating the silicon substrate and electrically connected to the pads is formed on the silicon substrate except for at least one position where the at least one groove is located; a second insulating layer is located on the first insulating layer and covers the front surface of the silicon substrate and the pad surface of the at least one functional chip, the pads of the functional chip under the first and second insulating layers are exposed through the first and second insulating layers, and the first and second insulating layer are made of similar photosensitive polymer materials; and the silicon substrate further includes electrical interconnect structures located on both the front surface and a back surface of the silicon substrate, and a first metal re-wiring located on the front surface and a second metal re-wiring located on the back surface, the pads are electrically connected to the electrical interconnect structures located on the front surface and the at least one conductive through hole through the first metal re-wiring, and the electrical interconnect structures located on the back surface are electrically connected to the at least one conductive through hole through the second metal re-wiring.

2. The packaging structure according to claim 1, further comprising: a first passivation layer located on the first metal re-wiring and a second passivation layer located on the second metal re-wiring, wherein openings are formed at preset positions of the first passivation layer and the second passivation layer to form the electrical interconnect structures.

3. The packaging structure according to claim 1, wherein the polymer bond between the at least one functional chip and the at least one groove is epoxy.

4. The packaging structure according to claim 1, wherein the at least one conductive through hole is axially perpendicular to the front surface of the silicon substrate.

5. The packaging structure according to claim 1, wherein a metal filled in the at least one conductive through hole is one or more of titanium, tantalum, chromium, tungsten, copper, aluminum, nickel and gold.

6. The packaging structure according to claim 1, wherein a metal filled in the at least one conductive through hole is one of low melting point solders including tin, tin silver, tin copper, tin gold, tin indium and tin silver copper.

7. The packaging structure according to claim 1, wherein the at least one conductive through hole is filled with a conductive adhesive.

8. The packaging structure according to claim 1, wherein a vertical cross-sectional of the at least one groove is rectangular or trapezoidal, and a depth of the at least one groove is less than or equal to a thickness of the silicon substrate.

9. The packaging structure according to claim 1, wherein the electrical interconnect structures are one of solder balls, metal bumps and conductive adhesives.

10. The packaging structure according to claim 1, wherein the first metal re-wiring and the second metal re-wiring are made of one of copper, nickel, target and gold.

11. The packaging structure according to claim 1, wherein the first metal re-wiring and the second metal re-wiring are formed by one method of electroplating, electroless plating, vacuum evaporation and physical vapor deposition.

12. The packaging structure according to claim 1, wherein forming processes of the first metal re-wiring and the second metal re-wiring include: depositing a seed metal layer on an insulating layer, coating, photolithography, exposure, development, electroplating, degumming and etching the seed metal layer.

13. The packaging structure according to claim 1, wherein forming processes of the first metal re-wiring and the second metal re-wiring include: depositing a seed metal layer on an entire surface of an insulating layer, exposing a metal re-wiring pattern on the seed metal layer, forming a metal circuit on the exposed metal re-wiring pattern and removing the seed metal layer outside the metal re-wiring pattern.

14. The packaging structure according to claim 1, wherein the silicon substrate is a wafer, and the at least one groove includes a plurality of grooves arranged in array.

15. The packaging structure according to claim 1, wherein the at least one functional chip is an integrated circuit chip or a MEMS chip.

* * * * *